United States Patent [19]

Washburn et al.

[11] Patent Number: 5,705,044
[45] Date of Patent: Jan. 6, 1998

[54] MODULAR SPUTTERING MACHINE HAVING BATCH PROCESSING AND SERIAL THIN FILM SPUTTERING

[75] Inventors: Hudson A. Washburn, Santa Clara; Jarrett L. Hamilton, Half Moon Bay, both of Calif.

[73] Assignee: Akashic Memories Corporation, San Jose, Calif.

[21] Appl. No.: 511,665

[22] Filed: Aug. 7, 1995

[51] Int. Cl.$^6$ .................... C23C 14/34; C23C 14/56
[52] U.S. Cl. .................. 204/298.25; 204/298.03; 204/298.07; 204/298.09; 204/298.15; 204/298.18; 204/298.17; 204/298.19; 204/298.2; 204/298.23; 204/298.27
[58] Field of Search .............. 204/298.07, 298.09, 204/298.12, 298.15, 298.16, 298.17, 298.19, 298.2, 298.21, 298.22, 298.23, 298.25, 298.26, 298.27, 298.28, 298.03, 298.18; 414/217, 222; 118/719

[56] References Cited

U.S. PATENT DOCUMENTS

| | | | |
|---|---|---|---|
| 4,401,539 | 8/1983 | Abe et al. | 204/192 |
| 4,569,746 | 2/1986 | Hutchinson | 204/298.09 |
| 4,701,251 | 10/1987 | Beardow | 204/298.25 |
| 4,756,815 | 7/1988 | Turner et al. | 204/298 |
| 4,786,564 | 11/1988 | Chen et al. | 428/694 |
| 4,810,346 | 3/1989 | Wolf et al. | 204/298 |
| 4,869,802 | 9/1989 | Wirz et al. | 204/298.16 |
| 4,911,810 | 3/1990 | Lauro et al. | 204/298.25 |
| 4,971,674 | 11/1990 | Hata | 204/192.12 |
| 5,033,406 | 7/1991 | Lee | 118/500 |
| 5,106,470 | 4/1992 | Takei et al. | 204/192.12 |
| 5,126,027 | 6/1992 | Kudo et al. | 204/298.25 |
| 5,174,875 | 12/1992 | Hurwitt et al. | 204/192.12 |
| 5,180,478 | 1/1993 | Hughes | 204/298.09 |
| 5,215,420 | 6/1993 | Hughes et al. | 204/298.25 |
| 5,228,968 | 7/1993 | Zejda | 204/298.07 |
| 5,244,554 | 9/1993 | Yamagata et al. | 204/192.2 |
| 5,262,030 | 11/1993 | Potter | 204/298.2 |
| 5,316,864 | 5/1994 | Hedgcoth | 428/611 |
| 5,512,150 | 4/1996 | Bourez et al. | 204/298.12 |

FOREIGN PATENT DOCUMENTS

| | | | |
|---|---|---|---|
| 62-60865 | 3/1987 | Japan | 204/298.11 |
| 2030-757-A | 2/1990 | Japan | 204/298.2 |
| 5-230649 (A) | 9/1993 | Japan | 204/298.2 |

OTHER PUBLICATIONS

Abe et al. "Planar Magnetron Sputtering Cathode With Deposition Rate Distribution Controllability," *Thin Solid Films*, 96:225–233 (1982).

*Primary Examiner*—R. Bruce Breneman
*Assistant Examiner*—Rodney G. McDonald
*Attorney, Agent, or Firm*—Townsend and Townsend and Crew LLP

[57] ABSTRACT

A flexible, modular sputtering machine comprises a number of batch process stations which define a batch process path. At least one of the batch process stations is a sputtering station including a serial sputtering chamber and an interchamber disk transfer mechanism. The disks move in batches along the process path, being individually processed only at the sputtering chamber. A preferred sputtering source is also provided which allows selective sputtering of multiple materials within a single sputtering chamber. The selection of sputtering materials is controlled by varying the magnetic field within the sputtering chamber. A cassette for transporting and holding batches of disk substrates during batch processing allows individual access to the disks for the interchamber disk transfer mechanism.

27 Claims, 5 Drawing Sheets

MODULAR SPUTTERING MACHINE HAVING BATCH PROCESSING AND SERIAL THIN FILM SPUTTERING

BACKGROUND OF THE INVENTION

1. Field of the Invention

The present invention relates generally to vacuum deposition, and more particularly to a thin film sputtering machine having a batch process path and a serial sputtering chamber.

Sputtering systems generally allow the deposition of a film of a selected material onto a substrate. Sputtering has found increasing applications in the fabrication of integrated circuits from silicon wafers, and particularly in the production of magnetic recording media.

Modern sputtering systems generally include a magnetron which produces a magnetic field in front of the target. The magnetic field intensifies and confines the plasma to a stable region in front of the target, greatly improving the efficiency and deposition rates of the process, and also reducing the heating of the substrate.

There are two types of systems generally used to sputter magnetic recording disks. The first, referred to as a "disk-by-disk" system, produces sputtered films of the highest possible quality. Disk-by-disk systems utilize a serial process method in which each substrate is placed individually between circular magnetrons where a single layer is deposited. The substrate moves sequentially to subsequent sets of circular magnetrons until all desired layers have been deposited. Each substrate must be individually aligned with the sputtering target at a fixed distance and sputtered at a fixed position. The main advantage of the disk-by-disk systems is the circumferential uniformity of the layer structure, which results in uniform magnetic recording characteristics.

Disk-by-disk sputtering systems suffer from serious disadvantages. The serial sputtering process greatly increases costs, in part from the need for a complex handling system to move the disks one at a time from one set of sputtering sources to another. These handling systems also greatly reduce the sputtering system reliability. No increase in through-put is achieved with smaller disks, as a sputtering machine only produces a single product at any given time. Furthermore, the sputtering chamber must be evacuated and back-filled each time it is opened to introduce another substrate.

Another factor limiting the efficiency of serial sputtering is the requirement to provide separate sputtering chambers for each deposition material. Magnetic recording characteristics benefit from sputtering a magnetic recording layer immediately after sputtering an underlayer on the recording media substrate. As noted above, however, the sputtering target and the substrate are preferably axially aligned within the sputtering chamber to provide a uniform film thickness. A sputtering chamber could be constructed having separate underlayer and magnetic layer sputtering sources, but would again require mechanical moving parts to transfer the disk from one sputtering source to the other, and would also result in a large sputtering chamber volume having large pressure loads on its structure.

The second type of sputtering system which is generally used to sputter magnetic recording disks is referred to as a "pass-by" system. Pass-by systems utilize a steady-state process in which several substrates are loaded on a pallet and the pallet passes between a series of long rectangular magnetrons which sequentially deposit the desired layers on both sides of the disks. These magnetrons must be separated to prevent cross-contamination. The main advantage of pass-by systems is that several disks an be placed on a pallet and sputtered at one time, and as the size of the disk decreases, more disks can be sputtered at the same time.

Steady-state sputtering deposition processes, in which substrate disks pass through a scanning sputtering stream, result in an undesirable anisotropy of the deposited film. First, pass-by systems deposit a non-uniform film layer due to inherent thickness variations when passing a circular disk by a rectangular target. Additionally, pass-by systems exhibit an angle of deposition variation as the disk approaches the sputtering zone, is directly in front, then leaves the sputtering region. Specifically, some portion of the disk will be sputtered while the sputtering stream is scanning the substrate radially towards or away from the center of the disk. Alternative portions of the disk are sputtered while the sputtering stream is scanning tangentially across that portion of the disk. These non-uniformities result in modulation due to variation in magnetic properties circumferentially around the disk.

Although the anisotropy of pass-by systems can be alleviated to some extent by rotating the disk during the sputtering process, this requires the presence of mechanical moving parts in the harsh environment of the sputtering chamber, and often prevents simultaneous sputtering of both sides of a substrate disk. Disk handling machinery costs are another disadvantage of pass-by systems; to take advantage of the increased throughput when reducing the substrate size, the handling systems used to load and unload the substrates from the pallets often must change to faster, more accurate automated machines which are very expensive. These additional system components decrease the cost advantages of pass-by systems.

A disadvantage of both the pass-by and disk-by-disk sputtering systems is an inherent delay between sputtering successive layers while the disks are moved from one location to another. Magnetic disks generally involve two or more layers, and the quality of the films of upper layers depends on the quality of the lower layers. In particular, an underlayer of chromium or chromium alloy is often used with a cobalt alloy magnetic layer over it. A high coercivity of the cobalt layer is important to achieve high density recording properties. However, if the chrome layer gets an oxide layer on it before the cobalt alloy layer is deposited, the coercivity decreases. Any delay between the end of the chrome sputtering and the beginning of the cobalt sputtering allows some oxide to form, even in a high vacuum, because there is always some residual oxygen in any vacuum system. Thus, the delay inherent between deposition of subsequent layers in both pass-by and disk-by-disk systems limits the recording properties of magnetic recording media.

For these reasons it would be desirable to provide improved sputtering deposition methods and devices which provide the benefits of batch sputtering processes, but which would not compromise the sputtering film quality. It would be particularly desirable to provide a flexible sputtering machine which could produce a variety of sputtered layer structures. It would be especially desirable if such a sputtering machine could produce a sputtered layer of a first material, and could immediately sputter a second layer of a second material over the first layer. It would be best if such capabilities could be realized without a large, complex, expensive sputtering apparatus having a large number of moving mechanical parts within the harsh environment of the sputtering chamber.

2. Description of the Background Art

U.S. Pat. No. 5,316,864 describes a steady-state production sputtering machine and describes the anisotropy of "pass-by" recording media. U.S. Pat. No. 4,869,802 describes an apparatus for rotating the substrate during the sputtering process. U.S. Pat. No. 5,228,968 describes a cathode sputtering system having an axial gas distribution. U.S. Pat. No. 5,180,478 describes a sputtering source having a coolant path behind a target. U.S. Pat. No. 4,786,564 describes magnetic recording media which include a sputtered underlayer over which the magnetic layer is immediately sputtered.

SUMMARY OF THE INVENTION

A sputtering machine according to the principles of the present invention comprises a plurality of successive batch process stations. The batch process stations are aligned to define a batch path, each of the process stations including at least one process chamber and a batch driver to advance batches of substrates between successive process stations along the batch path. Valves isolate successive process stations, and are generally provided at the beginning and end of the batch path.

At least one of the process stations comprises a sputtering station which includes a batch chamber along the batch path and an adjacent sputtering chamber disposed adjacent to the batch chamber off of the batch path. The sputtering station further includes an interchamber disk transfer mechanism, allowing individual disks to be individually and sequentially moved to and sputtered within the sputtering chamber, while the remaining disks are held in the batch chamber along the batch path. Thus, the disks are processed and moved between stations in economical batches along much of the process path.

Preferably, the disk transfer mechanism of the sputtering machine of the present invention lifts the disk from a cassette upward toward the sputtering chamber. Ideally, the cassettes move horizontally along the batch path, and allow the disk transfer mechanism to select an individual disk for sputtering based on the location of the cassette along the cassette path. These provisions minimize the mechanical complexity of the sputtering machine, allowing the disk transfer mechanism to operate with a single axis of movement, while the sputtering station driver does double duty, performing both as a cassette driver mechanism and as a serial disk sputtering selector, also with only a single axis of movement. This arrangement is facilitated by independently controlling the cassette driver of the sputtering station from the cassette drivers of other process stations.

Preferably, the adjacent sputtering chamber is disposed above the batch chamber, and a heating chamber is disposed above the sputtering chamber. The disks may thus be individually preheated within the heating chamber with a minimum risk of debris from the sputtering chamber falling onto the disk during heating. Additionally, the present disk transfer mechanism is preferably able to cradle the individual disks from below, and to lower the disks back into the cassette so as to avoid articulated parts being subjected to the heating and sputtering chambers.

Advantageously, the individual batch process stations of the present sputtering machine can be formed as "modular" units. As used herein, "modular" means a process having a standard structural interface at which it is detachably secured to successive process stations along the batch path. The sputtering layer structure may therefore be reconfigured by altering the order and number of batch process stations along the batch path. Similarly, the gate valves may be economically produced as modular units and sealingly attached to the adjacent process stations.

A sputtering source according to the present invention comprises an inner sputtering target and an outer sputtering target formed of a different material than the inner target. A concentric coil magnetron is disposed behind the inner and outer targets, the magnetron having at least one inner coil and at least one outer coil.

Selective application of electrical currents to the inner and outer coils of the magnetron vary the magnetic fields produced by the sputtering source of the present invention, allowing selective sputtering of either the inner or outer target. Hence, the sputtering source of the present invention is capable of applying two separate layers of different materials within a single sputtering chamber. No additional mechanical moving parts are required within the harsh sputtering environment. Furthermore, the layers may be applied without any time delay between them, and without any need to open the sputtering chamber, thereby decreasing both the possibility of contamination between sputtered layers and the energy required to evacuate and back-fill the sputtering chamber with sputtering gas. The present sputtering source is particularly advantageous when combined with the present sputtering machine, allowing immediate consecutive sputtering of multiple, high quality film layers on substrate disks which can be pretreated and post-treated in economical batch groups.

Preferably, at least one of the inner and outer coils of the sputtering source includes a plurality of concentric subcoils. Each of these subcoils has an independent electrical subcurrent, allowing either the first or second magnetic field to vary, thereby sweeping the plasma over the inner or outer target. Such sweeping of plasma greatly improves the target material utilization. Additionally, at least one of the inner target and the outer target of the present sputtering source preferably includes a conical sputtering surface, thereby allowing deposition of uniform layers over a coaxial substrate despite the difference in radial location of the inner and outer sputtering targets. The present sputtering source is particularly well suited for the sputtering of an underlayer directly followed by the sputtering of a magnetic recording layer for production of magnetic recording media.

The present invention further provides a cassette for supporting a plurality of disks. The cassette comprises a first end plate having a bottom edge, a second end plate, and three parallel rods extending horizontally from the first end plate to the second end plate. The rods each include a plurality of notches which are aligned so as to define a plurality of arcs on parallel planes. The rods are positioned so that no notch is more than 90° from a lowest point on the arc. Additionally, no rod is within 10° of that lowest point. The present cassette is particularly well suited for batch processing of disks, allowing convective or forced airflow for heating, cooling, or other processes with minimal interference from the cassette structure, and without binding of the disks against the cassette due to thermal expansion. Additionally, the disks may be lifted from below by a cradle on the end of a blade without interference from any of the three parallel rods.

Preferably, a cassette according to the present invention further comprises a drive bar extending from the first end plate to the second end plate, typically comprising a linear gear rack for driving the cassette along the cassette path of the present sputtering machine. The drive bar may optionally be integrated with one of the three parallel rods. Ideally, the drive bar includes a drive surface which is accessible from beyond the first and second end plates, allowing the cassette to be driven along a cassette path past a drive mechanism which engages the drive surface. The present cassette will preferably hold between five and 100 disks, ideally holding between 20 and 50 disks. The present disk cassette, sputtering machine, and sputtering source provide a simple, flexible, and highly reliable sputtering system which is especially advantageous for the fabrication of high performance magnetic recording media at low cost.

The present invention further provides a method for sputtering a plurality of disks, the method comprising advancing batches of the disks along a batch process path defined by a plurality of successive batch process stations. At least one of the process stations is a sputtering process station. Each batch of disks is isolated at each successive process station by closing valves disposed between the successive process stations. Each batch of the disks is, in turn, isolated within the sputtering process station. Each disk of this batch is individually transferred to an adjacent sputtering chamber disposed off the batch path, where it is sputtered.

Preferably, the lifting step comprises raising the disk through the sputtering chamber to a heating chamber and lowering the heated disk to the sputtering chamber. Generally, the disks are pre-treated as a batch along the path at a pre-treating process station, and are post-treated as a batch along the path at a post-treating process station. Typically, the pre-treating step comprises evacuating air from around the disks and heating the disks within the cassette. Similarly, the post-treating step generally comprises cooling and repressurizing the sputtered disks. Preferably, the method further comprises individually lifting each disk from a cassette to an overlayer sputtering chamber at an overlayer sputtering station, where each disk is sputtered with an overlayer.

DETAILED DESCRIPTION OF THE SPECIFIC EMBODIMENTS

The present invention provides a sputtering machine which is formed as a series of modular processing stations. Each station is isolated from other processing stations and from the outside environment, and is adapted to process a batch of disks carried by a cassette. The process stations are arranged to process each cassette of disks in a particular order. Each cassette travels along a batch path, and is processed at each station consecutively. Although the present sputtering machine will be described with reference to a specific arrangement of processing stations, it is an advantage of the present modular sputtering machine that the process stations can be easily rearranged to fabricate alternative sputtered layer structures.

The present invention will find use throughout a wide variety of sputtering applications, including the fabrication of integrated circuits from semiconductor wafers. The present sputtering machine will find its most immediate application in the fabrication of magnetic recording media, particularly in the production of rigid magnetic recording disks on aluminum and non-metallic substrates. The present sputtering machine allows batch processing of such magnetic recording media during preheating and post-sputtering cooling. The disks are individually serially processed only during sputtering of underlayers, magnetic layers, and overlayers, providing the highest possible quality of magnetic recording media at the minimum cost. The present invention thus combines the advantages of batch processing with the high quality of serial sputtering, and avoids the use of complex mechanical manipulators through a novel cassette, cassette driver system, and disk transfer mechanism.

Figure 1:
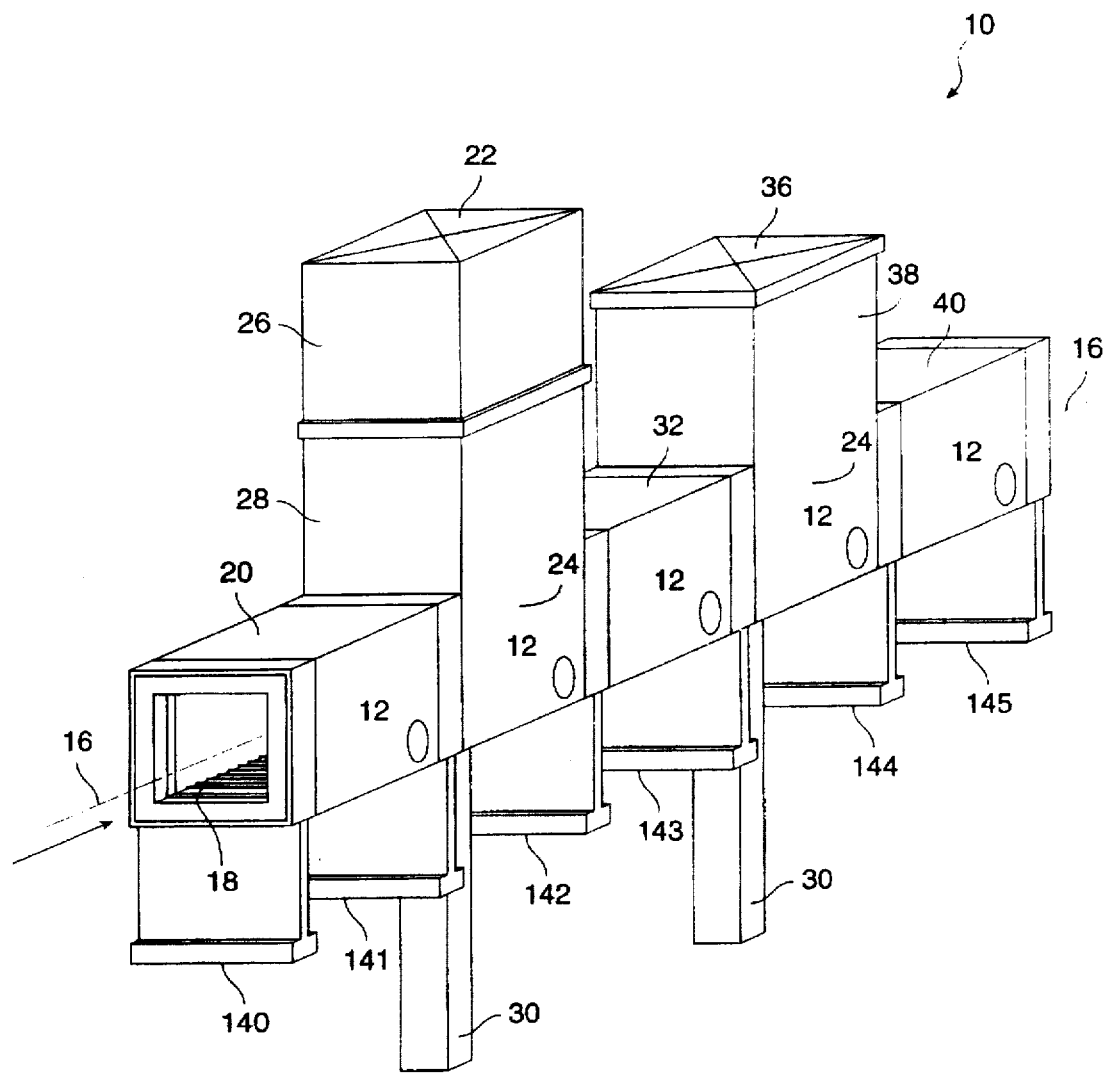
FIG. 1 is a perspective view of a sputtering machine according the principles of the present invention.
Figure 2:
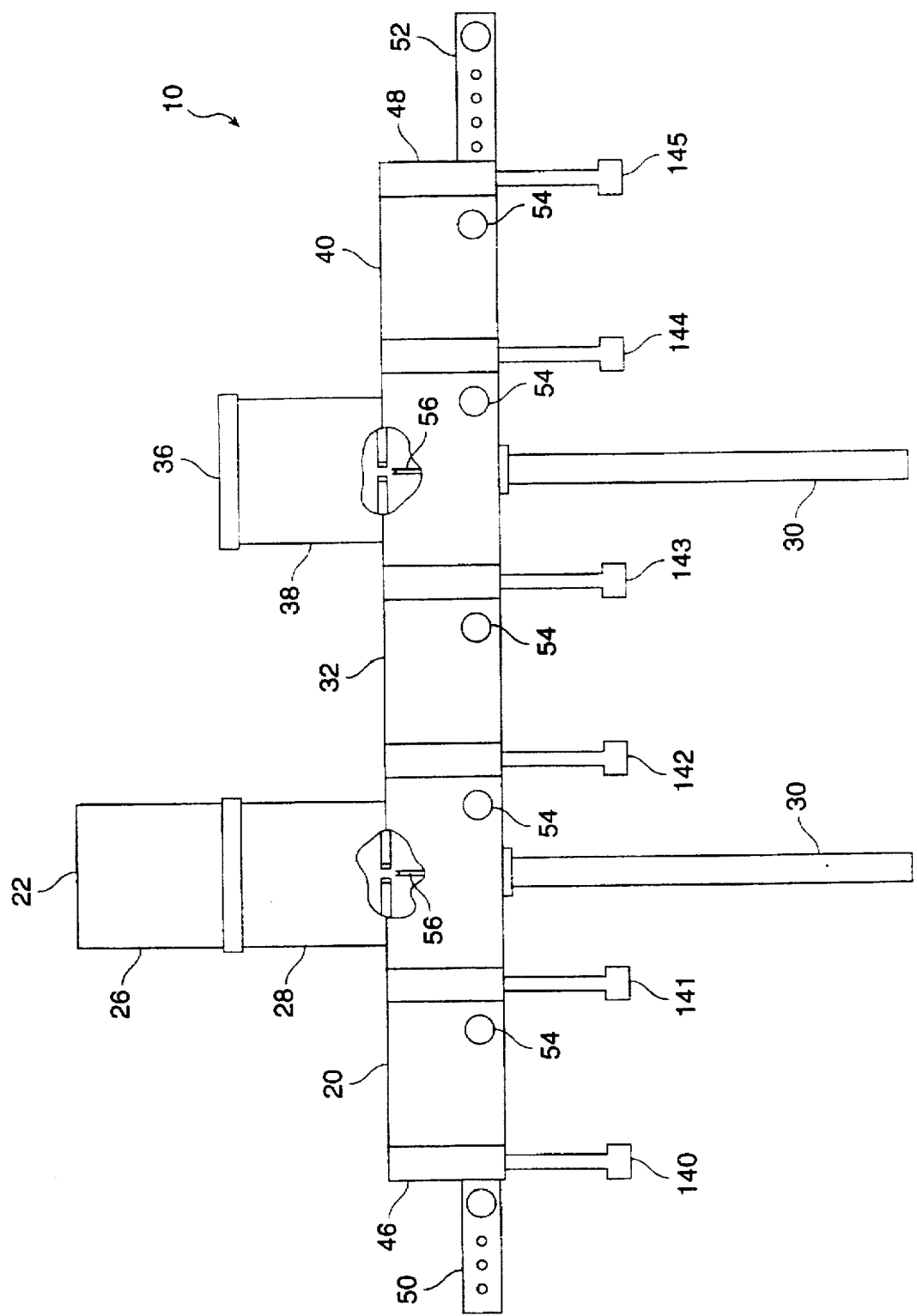
FIG. 2 is a side view of the sputtering machine of FIG. 1, showing the batch process stations, batch path, and interchamber disk transfer mechanisms.

Referring now to FIGS. 1 and 2, a sputtering machine 10 according to the principles of the present invention comprises a series of process stations 12 arranged horizontally. Modular gate valves 140–145 separate each of the process stations, and are also provided at either end of the sputtering machine 10. A batch path 16 extends in a straight line horizontally through batch process stations 12. A cassette driver 18 is included in each process station to advance cassettes along batch path 16. Cassettes of disks are moved from one process station to another by opening a gate valve and advancing the cassette using cassette driver 18.

Cassettes of disks will first be processed in a load and preheat station 20. The cassette of disks is transported into a chamber within preheat station 20 and first and second gate valves 140, 141 are sealed. The atmosphere within the chamber is evacuated to a pressure below about 0.01 mTorr. A flow of heated nitrogen gas is introduced at the top of the chamber and is pumped out from below. Simultaneously, heating lamps on the interior walls of the chamber are turned on. Preferably, the walls are water cooled on the outside to prevent excess heat from reaching the exterior surface of preheat station 20. The disks within the cassette are heated until they attain an average temperature in the range between 50° and 250° C. The disks are then stabilized at the desired temperature with nitrogen gas flow. When the sputtering machine is ready to transfer the cassette of disks to the next chamber, the nitrogen gas flow is turned off and the chamber is again pumped down to below 0.01 mTorr. Preferably, the gas which will be used in the next chamber is then provided in the chamber of preheat station 20. In the sputtering machine of FIG. 1, argon is provided at a pressure equal to the ambient pressure within the adjacent sputtering station. This prevents any contaminating gas from entering the next chamber, and also minimizes any sudden changes in pressure caused by opening by second gate valve 141.

After preheating, gate valve 14 is opened and the cassette of disks is transferred into a metals processing station 22. Metals processing station 22 is a sputtering station which is particularly well suited for sputtering an underlayer and a magnetic recording layer for magnetic recording media. Metals processing station 22 includes a cassette chamber 24, a heating chamber 26, and a sputtering chamber 28. Interchamber disk transfer mechanism 30 is provided to move the disks between the chambers of metal processing station 22.

The cassette of disks are maintained at an elevated temperature within cassette chamber 24 by additional heaters along the chamber walls. Individual disks are lifted from the cassette and raised through sputtering chamber 28 to heat chamber 26. The temperature of the disk is raised to the desired process temperature, generally being between 220° and 300° C. This rise in temperature will take between 0.5 to 3 seconds. Once the desired process temperature has been achieved, the disk is lowered into sputtering chamber 28. An underlayer, typically comprising chromium, is generally sputtered first, preferably followed immediately by a magnetic recording layer using the concentric target sputtering source described hereinbelow. Alternatively, a single metallic layer is sputtered, and additional metal processing stations 22 are provided. The sputtering of the underlayer and magnetic layer typically takes between 1.5 and 5 seconds for each disk. After the underlayer and magnetic layer are sputtered, the disk is lowered back into the cassette by disk transfer mechanism 30. This process is repeated for each disk within the cassette.

Once each disk in a cassette has been sputtered within metals processing station 22, the gas and pressure within the third process station are adjusted to match those of the metals processing station and third gate valve 142 is opened to allow access to the third process station, a cooling process station 32. It serves to cool the disks, and also to isolate the two sputtering chambers. After the cassette enters and the gate valve is closed, the cooling process chamber is evacuated and back-filled with a thermal transport gas, preferably helium, argon, or nitrogen, at a pressure in the range between 10 and 1000 mTorr. Preferably, the walls of cooling process station 32 are cooled by means of a refrigerant, while the thermal transport gas efficiently transfers the cooling to the disks. The disks are generally cooled to a temperature in the range between 0° to 100° C. in a time ranging between two and five minutes. When the desired temperature is reached, cooling process station 32 is evacuated and then back-filled with the gas and pressure found in the next chamber. Once again, when the cassette is ready, the fourth gate valve 143 opens to provide access to the next chamber and the cassette is advanced using a cassette driver.

The cassette is next advanced into a carbon sputtering station 36 having a cassette chamber 24 and an interchamber disk transfer mechanism 30 similar to metal processing station 22, described above. Here, disk transfer mechanism 30 lifts the disk directly into a carbon sputtering chamber 38. The disk is sputtered and then lowered into the cassette. Time for processing each disk is typically in the range between four and ten seconds. No heat chamber need be provided for the sputtering of carbon, which benefits from lower sputtering process temperatures. Once all disks in the cassette have been sputtered, the cassette is ready to advance to the next process-station, as described above.

The final process station is an exit lock 40. Once a cassette is sealed within exit lock 40, the exit lock chamber is vented with nitrogen, bringing the pressure up to atmospheric. The final gate valve is opened and the cassette is transferred outside of sputtering machine 10. After the final gate valve is closed, the chamber is pumped down to below 0.001 mTorr, and back-filled with the same gas and pressure as exists in carbon processing station 36. The exit lock is then ready for the next cassette.

As most clearly seen in FIG. 2, sputtering machine 10 provides a horizontal batch process path. Each process station is preferably isolated by gate valves 141–144, and each typically includes an environmental control system for controlling at least one of temperature, pressure, internal gas composition, and the like. The process path further includes an entry valve 140 and an exit valve 145 to isolate the path from the external environment. The entry and exit valves are subjected to larger pressure differences than the other gate valves, and are optionally different in structure. Typically, an inlet conveyor 50 and an exit conveyor 52 transport loaded cassettes to and from sputtering machine 10.

While inside sputtering machine 10, the cassettes are driven along the batch path by independently controlled driver motors 54. Each driver motor 54 preferably comprises a stepper motor. Alternatively, feedback on the location of cassettes is generally provided. The cassettes may be advanced by a wide variety of mechanisms, including conveyor belts, powered rollers, linear screws, rotating ball drives, and the like. Preferably, at least one pinion at each process station engages a drive bar on the cassette, as described hereinbelow. To transport individual disks between chambers, an extendable blade 56 lifts a disk from the cassette, holding only the lower portion of the outer diameter. Driver motor 54 of each sputtering station controls which disk is lifted by selectively positioning the cassette along the path. Clearly, a wide variety of transport mechanisms and cassette structures could be used to hold and/or translate the batch of cassettes along the batch path.

Figure 3:
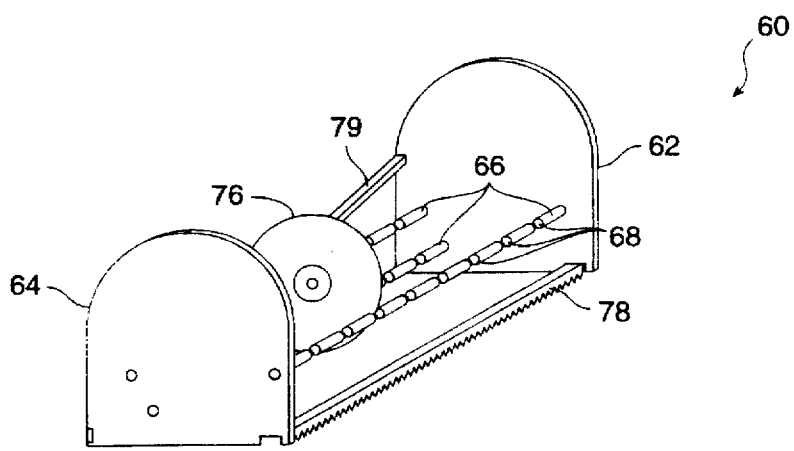
FIGS. 3, 4, and 4A illustrate a disk holding cassette according to the present invention.
Figure 4:
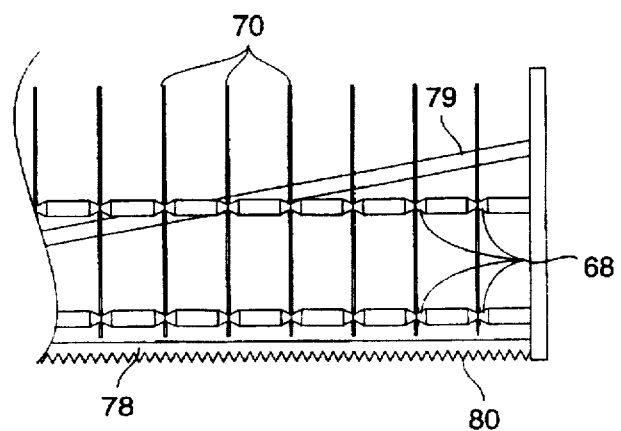
Figure 4A:
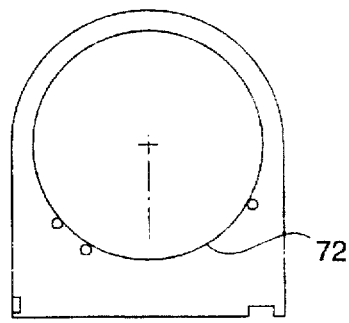

Referring now to FIGS. 3, 4, and 4A, a preferred cassette 60 comprises a first endplate 62, a second endplate 64, and three rods 66 between the endplates. Each rod includes a series of evenly spaced notches 68, so that the notches of the three rods define a series of vertical planes 70. The notches further define arcs 72 on each plane 70. Preferably, no rod is located within 10° of a lowest point 74 on arc 72 to provide access for blade 56 to lift each disk 76. Similarly, so long as no rod is more than 90° from lowest point 74, disk 76 may be lifted straight upward without interference. A drivebar 78 having drivegears 80 allows positive movement of the cassette along the path. The drivegears are accessible without interference from the endplates. Optionally, one or more cross-members 79 connect the endplates to increase rigidity and stability. Cross-member 79 is disposed outside disk holding rods 66 so as to avoid interference with the disks and disk transfer mechanism.

Cassette 60 comprises a material which will withstand the batch process temperatures of sputtering machine 10 without degrading, and is preferably made of metal, ideally comprising polished stainless steel or a polyamide material such as Vespal™. Similar materials should be used for the rods and endplates to avoid differential thermal expansion. Advantageously, cassette 60 holds disks firmly without binding as they expand.

Figure 5:
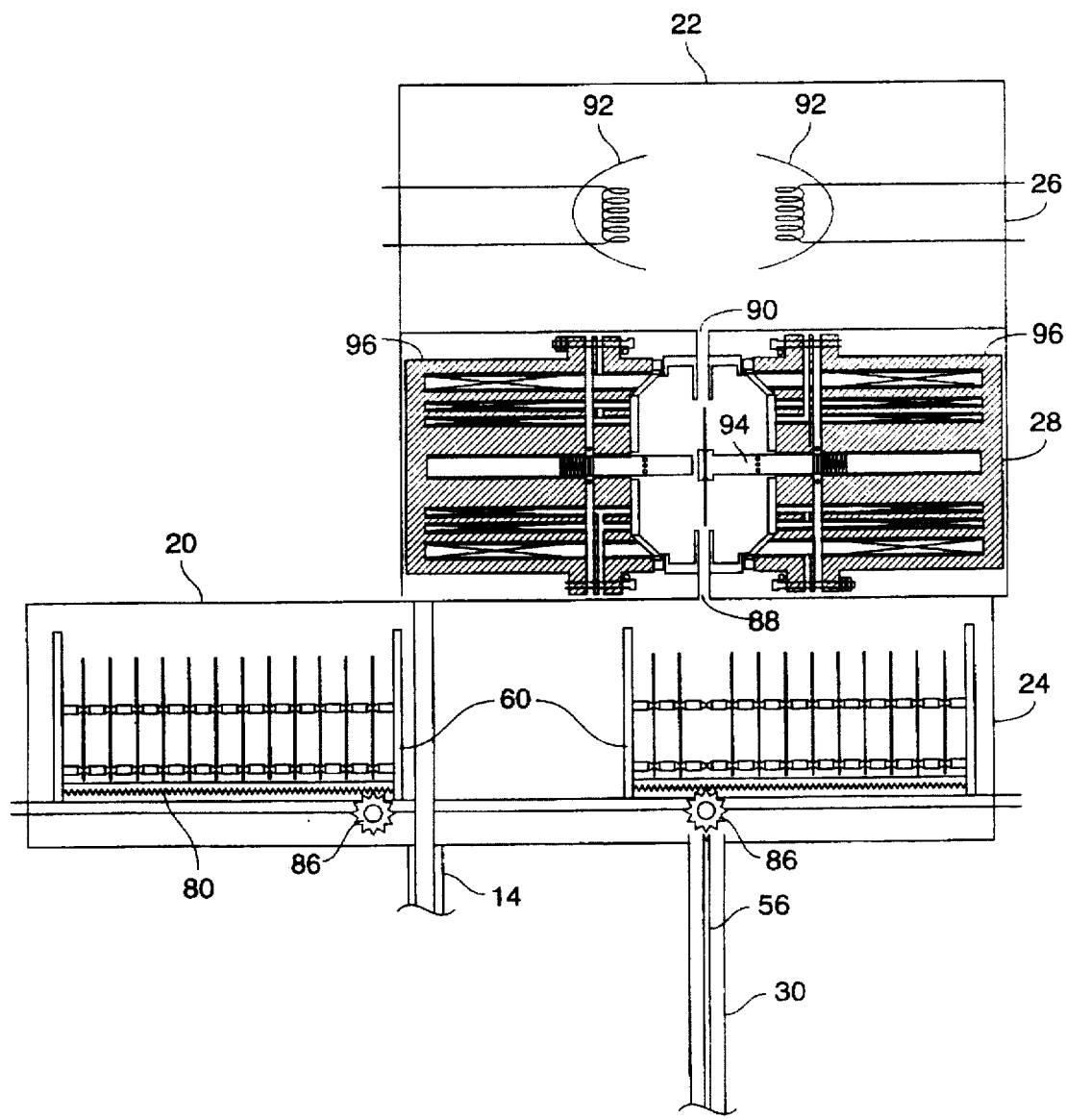
FIG. 5 is a schematic cross-section of a pretreating station and a sputtering station of the sputtering machine of FIG. 1.

Referring now to FIG. 5 cassettes 60 are advanced along the cassette path by pinions 86, which engage drive gears 80. Drive gear 86 of metals processing station 22 further interacts with disk transfer mechanism 30, as described above. Blade 56 lifts a selected disk through an opening 88 in the cassette chamber 24 to sputtering chamber 28, and through a second opening 90 to heat chamber 26. Heaters 92, typically comprising quartz heater lamps or the like, are preferably turned on before the disk is in position, thereby minimizing heat time. The disk is supported from the outer diameter by blade 56 during heating.

The disk is lowered to sputtering chamber 28 by blade 56, where it is preferably engaged by an inner diameter disk holder 94. The blade may then be lowered, as shown in FIG. 5. Alternatively, the disk is sputtered while held from the outer diameter by blade 56. In either case, an underlayer is sputtered on both sides of the disk using opposing concentric coil magnetrons 96. The underlayer typically comprises chromium, and is generally sputtered to a thickness of 30 to 100 nanometers.

The magnetic layer is sputtered over the underlayer by varying the magnetic field produced by a concentric coil magnetron 96, without any requirement for mechanical movement within sputtering chamber 28. The magnetic layer typically comprises an alloy of cobalt, generally sputtered to a thickness of 30 to 60 nanometers. Sputtering both layers will typically require between about 1.5 to 5 seconds. The disk is then lowered by blade 56, and the cassette advanced by drive gear 86 to the next disk. The total time for processing each disk within metals processing station 22 is about 5 to 15 seconds.

Figure 6:
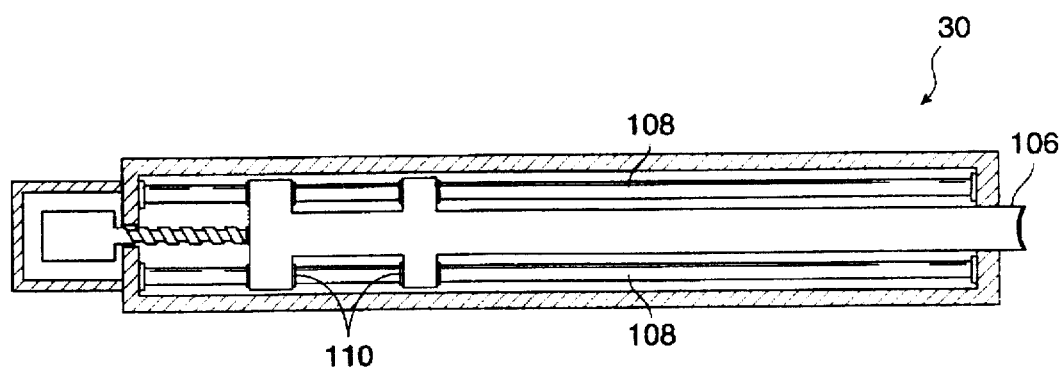
FIGS. 6 and 7 illustrate orthogonal cross-sections of a preferred disk transfer mechanism for use with the sputtering machine of FIG. 1.
Figure 7:
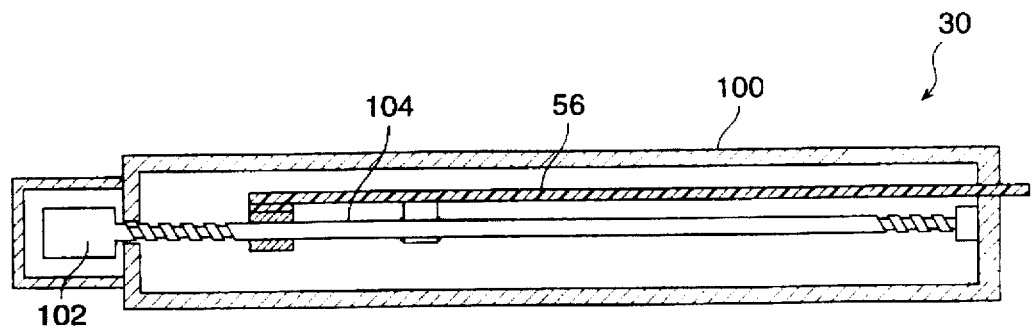

Referring now to FIGS. 6 and 7, blade 56 of interchamber disk transfer mechanism 30 is driven axially by a linear screw 104. Linear screw 104, in turn, is rotated by a stepper motor 102, so that a cradle 106 at the upper end of blade 56 advances upward or downward. The blade is supported by rods 108 and sliders 110, which are affixed to housing 100. Clearly, a wide variety of alternative actuation mechanisms may also be used, including hydraulic or pneumatic pistons, recirculating ball screws, drive belts, or the like.

Figure 8:
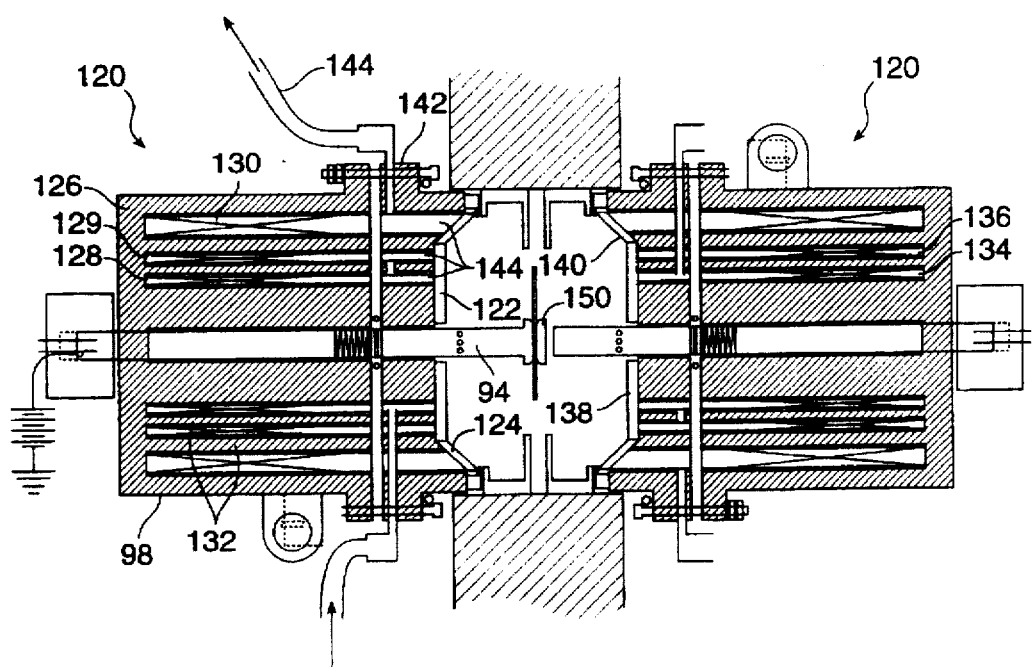
FIG. 8 illustrates two opposed sputtering sources having inner and outer sputtering targets, according to the principles of the present invention.

Referring now to FIG. 8, a sputtering source 120 according to the present invention includes an inner target 122 and an outer target 124. Concentric coil magnetron 96 includes a plurality of concentric magnetic coils having separate power supply connections. As more fully explained in U.S. patent application Ser. No. 08/416,011, filed Apr. 3, 1995, the full disclosure of which is hereby incorporated by reference, varying the current supplied to two concentric magnetic coils of such a sputtering source varies the location of the stable plasma region in front of a target. For example, applying a constant current to an inner coil and applying a constant current which is opposite in orientation (or negative) to the outer coil will result in a stable plasma region which is further in toward the center of the target than is produced by the inner coil alone.

Inner and outer targets 122, 124 of sputtering source 120 are generally in the form of concentric rings. Concentric coil magnetron 96 is radially symmetrical and is located coaxially with the targets. Concentric coil magnetron 96 will include a body 126 of magnetic pole material, a first inner subcoil 128, a second inner subcoil 129, and an outer coil 130. Between each of the coils are middle poles 132 formed of magnetic pole material. Suitable magnetic pole materials include iron, magnetic steel alloys, 410 stainless steel, 1013 steel, and the like. Middle pole widths will be different for different sputtering sources, the exemplary middle pole being in the range from 0.25 to 0.5 inches wide. First inner subcoil 128, second inner subcoil 129, and outer coil 130 will have independent electrical power supplies.

During sputtering, concentric coil magnetron 96 will confine a region of plasma in front of either inner target 122 or outer target 124. A controller applies current independently to the coils so that the magnetic fields of the inner and outer coils combine to confine the plasma together.

In the manufacture of magnetic thin film disks, the outer target 124 is preferably chromium or a chromium alloy and the inner target is preferably a cobalt alloy. Generally, the cobalt alloy target is more expensive and a higher utilization of this target is therefore preferred. Using two subcoils beneath the cobalt alloy target allows a greater utilization of the target material, as described more fully in application Ser. No. 08/416,011. This is more economical in use of the target, and also extends the life of the target so as to increase the time between target changes. Optionally, multiple subcoils could also be used beneath the chromium or chromium alloy target to improve its utilization and life. Optionally, the chromium (or other underlayer material) could be used as the inner target, and the cobalt alloy target could be used as the outer target.

To sputter inner target 122, first inner subcoil 128 is supplied with current so as to produce a first radial magnetic field directed outward (called the positive direction) above the target. This first magnetic field will be directly above the inner most coil, and will have a magnitude of at least about 200 Oe. Meanwhile, current is supplied to the second inner subcoil 129 so as to produce a second magnetic field above the second inner subcoil which oscillates in orientation between being positive and being negative (directed radially inward), the second field ideally varying between about −50% to about +100% of the strength of the first field. Current is preferably also supplied to outer coil 130 to produce a weak third magnetic field which is negative in orientation, the third field being located above the outermost coil and being much less than half the strength of the first field.

As the current through the second inner subcoil oscillates between positive and negative, the plasma will move between being positioned above the middle coil and being positioned above the innermost coil, respectively. Since inner target 122 covers both of these locations, the sputtering throughout these oscillations will be limited to the inner target material. The plasm oscillations will develop a wide erosion area covering the region between the two coils.

To sputter the outer target 124, the current through the first and second subcoils 128, 129 are set to zero and a positive current is applied to the outer coil 130. The plasma then is positioned above the outer coil, and thus sputters material from the outer target only. The positive and negative orientations may alternatively all be reversed throughout the above description.

During the processing of a disk with the concentric target arrangement, one of inner target 122 and outer target 124 is sputtered on a substrate, followed immediately by the other. Some small amount of material from each target is sputtered onto the other target surface, thereby presenting a possibility of cross-contamination. Assuming that inner target 122 is sputtered first and outer target 124 is sputtered second, deposition of the outer target material on the inner target surface causes little problem, since the first sputtering of the inner target consists of the outer target material and this just continues the earlier deposition of the outer target material on the substrate. However, a subsequent disk could suffer from cross-contamination from inner target material which remained on the outer target.

Certain actions can be taken to remove the effects of cross-contamination. Preferably, the outer target is resputtered for a very short time to clean up the outer sputtering surface before the subsequent disk is positioned within the chamber. This prepares the outer target surface for deposition of uncontaminated outer target material on the next substrate. Resputtering can occur with the previously processed disk still in the chamber, in which case a very thin film of the outer target material may be overlaid onto the disk, or it may occur after removing the processed disk and prior to introducing the subsequent disk in the chamber.

The targets of the sputtering source preferably include an outer sputtering surface 140 and an inner sputtering surface 138 which are at an angle relative to each other to compensate for their different radial locations, so that the substrate will receive a radially uniform film thickness from each target, and at the same time achieve a maximum deposition rate from each target. Only one erosion diameter on a flat target surface will produce an adequate uniformity of deposition on the substrate while maximizing the deposition rate. Since the inner target erosion diameter is preferably chosen to fit this requirement, the outer target, which is at approximately the same axial distance from the substrate, is preferably conical to both maximize the deposition rate—because the deposition rate generally follows a cosine law and is highest near the normal direction from the target—and also to achieve adequate film uniformity.

A pole cap 142 is disposed between the inner and outer targets and the coils. Pole cap 142 includes transition poles extending from middle poles 138 to the targets so as direct the magnetic fields towards the desired erosion areas. Hence, a cooling water path 144 within pole cap 142 concentrates cooling at the rear surface of the targets.

Optionally, inner diameter disk holder 94 extends axially from at least one of the two opposed sputtering sources 120. Disk holders which extend from both sputtering sources may capture the disk between them. Alternatively, an inner diameter engaging mechanism 150 firmly holds the disk in the required orientation. Inner diameter disk holder 94 further provides an axial sputtering gas supply and/or return path, ensuring the uniformity of the sputtering film thickness.

Although the present invention has been described in some detail by way of illustration and example, for purposes of clarity of understanding, it will be obvious that certain changes and modifications may be practiced within the scope of the present invention. For example, multiple sputtering chambers might be disposed side-by-side above the cassette chamber of the sputtering station to simultaneously sputter multiple disks. Thus the scope of the present invention should be limited only by the appended claims.

What is claimed is:

1. A sputtering machine comprising:
   a plurality of successive batch process stations defining a batch path, each process station comprising:
   walls defining at least one batch chamber disposed along the batch path, the walls sealably coupleable with at least one adjacent process station to isolate the batch path from a surrounding environment; and
   a batch driver to advance batches of substrates along the batch path; and
   a plurality of valves disposed between successive process stations and at a beginning and an end of the batch path;
   wherein two of the process stations comprise sputtering stations having a sputtering chamber disposed off the batch path, an interchamber transfer mechanism which transfers individual substrates between the batch chamber of the sputtering station and the sputtering chamber, and an environmental control system to maintain at least one of temperature, pressure, and gas composition within the batch chamber of the sputtering station and within the sputtering chamber so as to avoid evacuating the sputtering chamber individually for each substrate;
   wherein the environmental systems of the two sputtering stations independently control at least one of temperature, pressure, and internal gas composition for simultaneous sputtering with different deposition environments within the two sputtering chambers, the batch chambers of the sputtering stations being isolatable by the valves and sealingly coupled along the batch path so as to avoid evacuating a batch chamber from ambient pressure individually for each sputtering station; and
   wherein a process station is disposed along the batch path between the sputtering stations, the process station capable of selectively duplicating sputtering environments of each of the adjacent sputtering stations prior to sequentially opening valves between the process station and the adjacent sputtering stations to avoid altering the sputtering environments when batches of disks advance between sputtering stations.

2. A sputtering machine as claimed in claim 1, wherein the batch path comprises a horizontal cassette path, and wherein the disk transfer mechanism lifts a disk upward from a cassette to the sputtering chamber.

3. A sputtering machine as claimed in claim 2, wherein the interchamber transfer mechanism selects a disk from the cassette based on a location of the cassette along the cassette path.

4. A sputtering machine as claimed in claim 3, wherein the batch driver of at least one sputtering station advances independently of the batch drivers of each successive process station.

5. A sputtering machine as claimed in claim 1, wherein the sputtering chamber is disposed above the batch chamber, and a heating chamber is disposed above the sputtering chamber.

6. A sputtering machine as claimed in claim 5, wherein the interchamber transfer mechanism comprises a blade which lifts a disk from a cassette to the heating chamber and lowers the disk from the heating chamber to the sputtering chamber.

7. A sputtering machine as claimed in claim 6, further comprising an inner diameter disk holder disposed in the sputtering chamber.

8. A sputtering machine as claimed in claim 1, wherein the process stations are modular and define an alternative batch path for depositing an alternative sputtered layer structure when disposed in an alternative order.

9. A sputtering machine as claimed in claim 8, wherein each valve comprises a gate valve which is sealingly attached to at least one process station.

10. A sputtering machine as claimed in 1, wherein the sputtering chamber comprises a sputtering source having an inner sputtering target, an outer sputtering target disposed outside of the inner target, the outer target being formed of a material different than the inner target, and a concentric coil magnetron disposed behind the inner and outer targets.

11. A sputtering machine as claimed in claim 1, wherein the two sputtering stations comprise a metal deposition station adapted for sputtering at least one of a chromium underlayer and a magnetic recording layer, and an overlayer deposition station disposed along the batch path after the metals deposition station, the overlayer deposition station adapted for depositing an overlayer comprising carbon.

12. A sputtering machine as claimed in claim 11, wherein the process station disposed along the batch path between the metal and carbon deposition stations is adapted for reducing the temperature of the batches of substrates.

13. A sputtering machine as claimed in claim 12, further comprising a process station disposed along the batch path before the metal deposition station for pre-heating the batches of substrates.

14. A sputtering machine as claimed in claim 1, wherein the sputtering station further comprises an individual substrate heating-chamber disposed adjacent the sputtering chamber and off the batch path, wherein the interchamber transfer mechanism transfers substrates from the heat chamber, into the sputtering chamber through a first substrate passage, through the sputtering chamber, and out from the sputtering chamber through a second substrate passage which is different than the first substrate passage.

15. A thin film deposition system comprising:
first and second deposition stations, each deposition station including walls defining a batch chamber and a deposition chamber, and a mechanism to transfer substrates sequentially between the batch chamber and the deposition chamber;
a batch drive system to advance batches of the substrates along a batch path between the batch chambers of the first and second deposition stations, the deposition chambers being disposed off the batch path;
a plurality of valves to pass the batches of substrates, the valves disclosed at a beginning of the batch path, at an end of the batch path, and between the first and second deposition stations so that the batch path is isolatable from the surrounding environment, and so that the first and second deposition stations are isolatable from each other;
wherein each deposition station further comprises an environmental control system for maintaining a station environment within the batch chamber and the deposition chamber during deposition and during transfer of the substrates between the chambers of the deposition station, and wherein the environmental control systems of the first and second deposition stations are capable of providing different environments when the valves isolate the deposition stations; and
wherein a process station is disposed along the batch path between the deposition stations, the process station capable of selectively duplicating the station environment of the first and second deposition stations prior to sequentially opening valves between each deposition station and the process station to avoid altering the station environments when batches of disks advance between the deposition stations.

16. A thin film deposition system as claimed in claim 15, further comprising:
an inner sputtering target within a deposition chamber;
an outer sputtering target within the deposition chamber;
a concentric coil magnetron disposed behind the inner target and the outer target, the magnetron having an inner coil and an outer coil; and
a power supply capable of applying a first electrical current to the inner coil and a second electrical current to the outer coil so as to sputter the inner target without sputtering the outer target, the power supply further capable of applying a third electrical current to the outer coil without energizing the inner coil so as to sputter the outer target without sputtering the inner target;
wherein the outer target is disposed around the inner target, the outer target being formed of a different material than the inner target.

17. A thin film deposition system as claimed in claim 16, wherein at least one of the inner coil and the outer coil comprises a plurality of concentric sub-coils to improve utilization of at least one of the inner target and the outer target, and wherein the power source is further capable of providing a first sub-coil current to the first sub-coil and a second sub-coil current to the second sub-coil, the second sub-coil current oscillating between positive and negative relative to the first sub-coil current to sweep a plasma over the surface of the improved utilization target between an area adjacent first sub-coil and an area adjacent the second sub-coil.

18. A thin film deposition system as claimed in claim 16, wherein at least one of the inner target and the outer target includes a conical sputtering surface.

19. A thin film deposition system as claimed in claim 16, further comprising an inner diameter disk holder extending forward through the inner target, the disk holder being positioned to hold the substrate coaxially with the magnetron.

20. A thin film deposition system as claimed in claim 19, wherein the disk holder includes a gas supply system which distributes ionizing gas coaxially with the magnetron.

21. A thin film deposition system as claimed in claim 19, wherein the disk holder advances axially to engage a disk.

22. A thin film deposition system as claimed in claim 16, wherein one of the inner target and the outer target comprises an underlayer material and the other comprises a magnetic recording layer material.

23. A thin film deposition machine as claimed in claim 15, wherein each of the deposition stations are releasably sealable against a plurality of alternative stations so that a sequence of the stations along the batch path can be rearranged to deposit alternative film structures on the substrates.

24. A thin film deposition machine comprising:
a first valve for passing and sealing between batches of substrates, the first valve defining a beginning of a batch path;
a load station along the batch path after the first valve, the load station sealably engaging the first valve, the load station including walls defining a batch chamber disposed along the batch path and an environmental control system adapted to reduce the pressure and raise the temperature of the batches of substrates;
a metals deposition station, adapted for deposition of an underlayer comprising chromium over the substrate and a magnetic layer over the underlayer, the metals station having walls defining a batch chamber disposed along the batch path after the load station, a plurality of chambers for heating and deposition of the underlayer and the magnetic layer on individual substrates, the plurality of chambers disposed off the batch path, and a mechanism for transferring individual substrates of the batches of substrates from the batch path, through each of the plurality of chambers, and back to the batch path;
a cooling station, comprising walls defining a batch chamber disposed along the batch path and adapted to lower the temperature of the batches of substrates after deposition of the underlayer and the magnetic layer, the cooling station capable of selectively duplicating differing deposition environments of adjacent deposition stations to avoid altering the deposition environments when batches of disks advance along the batch path;
a carbon deposition station adapted for deposition of an overlayer comprising carbon over the magnetic layer, the carbon station having walls defining a batch chamber disposed along the batch path after the cooling station, a deposition chamber disposed off the batch path, and a mechanism for transferring the individual substrates of the batches of substrates from the batch path to the deposition chamber; and
an unload station disposed along the batch path after the carbon station, the unload station comprising walls defining a batch chamber and adapted to raise pressure for the batches of substrate;
a last valve disposed along the batch path after the carbon station for passing and sealing between batches of substrates, the last valve defining an end of the batch path; and a plurality of valves disposed along the batch path between each successive station for isolating the batches of substrates therein, the batch chambers along the batch path sealingly engageable with adjacent batch chambers so that the batches of substrates are isolated from a surrounding environment between the beginning and the end of the batch path.

25. A thin film deposition machine as claimed in claim 24, wherein each of the deposition stations are releasably sealable against a plurality of alternative process stations so that a sequence of the process stations along the batch path can be rearranged to deposit alternative film structures on the substrates.

26. A sputtering machine comprising:

a plurality of successive batch process stations defining a batch path, each process station comprising:
 walls defining at least one batch chamber disposed along the batch path, the walls sealably coupleable with at least one adjacent process station to isolate the batch patch from a surrounding environment; and
 a batch driver to advance batches of substrates along the batch path; and a plurality of valves disposed between successive process stations and at a beginning and an end of the batch path;

wherein two of the process stations comprise a metal deposition station adapted for sputtering at least one of a chromium underlayer and a magnetic recording layer, and an overlayer deposition station disposed along the batch path after the metals deposition station, the overlayer deposition station adapted for sputtering an overlayer comprising carbon, the sputtering stations having a sputtering chamber disposed off the batch path, an interchamber transfer mechanism which transfers individual substrates between the batch chamber of the sputtering station and the sputtering chamber, and an environmental control system to maintain at least one of temperature, pressure, and gas composition within the batch chamber of the sputtering station and within the sputtering chamber so as to avoid evacuating the sputtering chamber individually for each substrate;

wherein the environmental systems of the two sputtering stations independently control at least one of temperature, pressure, and internal gas composition for simultaneous sputtering with different deposition environments within the two sputtering chambers, the batch chambers of the sputtering stations being isolatable by the valves and sealingly coupled along the batch path so as to avoid evacuating a batch chamber from ambient pressure individually for each sputtering station;

wherein a process station is disposed along the batch path between the metal and carbon deposition stations for reducing the temperature of the batches of substrates, the cooling station isolatable from each of the deposition stations by the valves; and wherein the cooling station includes an environmental control system capable of selectively duplicating a sputtering environment of an adjacent sputtering station prior to opening a valve between the cooling station and the adjacent sputtering station.

27. A thin film deposition system comprising:

first and second deposition stations, each deposition station including walls defining a batch chamber and a deposition chamber, a mechanism to transfer substrates sequentially between the batch chamber and the deposition chamber, and an environmental control system for maintaining a deposition environment within the batch chamber and the deposition chamber, the environmental control systems capable of maintaining different deposition environments at the first and second deposition stations for deposition of different materials;

a plurality of batch process stations disposed before and after the first and second deposition stations and between the batch chambers of the first and second deposition stations along a batch path;

a batch drive system to advance batches of the substrates along the batch path;

a plurality of valves disposed at a beginning of the batch path, at an end of the batch path, and between adjacent deposition stations and batch process stations so that the batch path is isolatable from the surrounding environment, and so that the first and second deposition stations and the batch process stations are isolatable from each other;

wherein the batch process station adjacent to the deposition stations are capable of duplicating the adjacent deposition environment before the valves are opened to maintain the differing first and second deposition environments while batches of disks advance along the batch path.

* * * * *